United States Patent [19]
Gongwer

[11] Patent Number: 5,189,320
[45] Date of Patent: Feb. 23, 1993

[54] PROGRAMMABLE LOGIC DEVICE WITH MULTIPLE SHARED LOGIC ARRAYS

[75] Inventor: Geoffrey S. Gongwer, San Jose, Calif.

[73] Assignee: Atmel Corporation, San Jose, Calif.

[21] Appl. No.: 763,921

[22] Filed: Sep. 23, 1991

[51] Int. Cl.[5] .................................. H03K 19/177
[52] U.S. Cl. ............................................ 307/465
[58] Field of Search .............. 307/465, 465.1, 466, 307/468; 340/825.79, 825.83, 825.87; 365/233.5

[56] References Cited

U.S. PATENT DOCUMENTS

| | | | |
|---|---|---|---|
| 3,975,623 | 8/1976 | Weinberger | 307/465 |
| 3,987,287 | 10/1976 | Cox et al. | 307/465 |
| 4,032,894 | 6/1977 | Williams | 340/166 R |
| 4,195,352 | 3/1980 | Tu et al. | 364/900 |
| 4,233,667 | 11/1980 | Devine et al. | 340/825.87 |
| 4,433,331 | 2/1984 | Kollaritsch | 307/465 |
| 4,554,640 | 11/1985 | Wong et al. | 307/465 |
| 4,564,773 | 1/1986 | Tanizawa et al. | 307/445 |
| 4,642,487 | 2/1987 | Carter | 307/468 |
| 4,644,191 | 2/1987 | Fisher et al. | 307/465 |
| 4,742,252 | 5/1988 | Agrawal | 307/465 |
| 4,745,307 | 5/1988 | Kitamura et al. | 307/465.1 |
| 4,758,746 | 7/1988 | Birkner et al. | 307/465 |
| 4,831,285 | 5/1989 | Gaiser | 307/465 |
| 4,847,612 | 7/1989 | Kaplinsky | 340/825.80 |
| 4,886,987 | 12/1989 | Usami | 307/465 |
| 4,893,033 | 1/1990 | Itano et al. | 307/469 |
| 4,906,870 | 3/1990 | Gongwer | 307/465 |
| 4,912,342 | 3/1990 | Wong et al. | 307/468 |
| 4,942,319 | 7/1990 | Pickett et al. | 307/465 |
| 4,963,768 | 10/1990 | Agrawal et al. | 307/465 |
| 5,012,135 | 4/1991 | Kaplinsky | 307/465 |
| 5,079,451 | 1/1992 | Gudger et al. | 307/465 |
| 5,121,006 | 6/1992 | Pedersen | 307/465 |

OTHER PUBLICATIONS

Wakerly, John F., "Digital Design Principles and Practice", ©1989 by John F. Wakerly; pp. 136-139, 266.
"Programmable Logic Devices: Intel's PLD Packs Both Speed and Complexity," *Electronics*, Sep. 17, 1987, pp. 65-66.

*Primary Examiner*—Edward P. Westin
*Assistant Examiner*—Benjamin D. Driscoll
*Attorney, Agent, or Firm*—Schneck & McHugh

[57] ABSTRACT

A programmable logic device having multiple first logic arrays, such as AND arrays, each with a different set of inputs and all simultaneously operating, in which the outputs from two or more first logic arrays are shared in a single speed logic gate or array, such as an OR gate or array. In one embodiment, there are N first logic arrays and M second logic arrays connected such that each second logic array receives intermediate terms from every first logic array and intermediate terms from each first logic array are shared by plural second logic arrays. In a second embodiment, there are N first logic arrays and a plurality of second logic gates connected so that at least some of the second logic gates receive intermediate terms from two adjacent first logic arrays.

23 Claims, 2 Drawing Sheets

PROGRAMMABLE LOGIC DEVICE WITH MULTIPLE SHARED LOGIC ARRAYS

DESCRIPTION

1. Technical Field

The present invention relates to programmable logic devices (PLDs) characterized by their layout or interconnections within the integrated circuit.

2. Background Art

In U.S. Pat. No. 4,942,319, Pickett et al. describe a multiple page programmable logic device that includes a plurality of pages, each page serving as a separate logic array, and suitably fast page control circuitry that allows an appropriate page or pages to be selected. For example, there may be a set of N first logic arrays forming AND array pages followed by a set of M second logic arrays forming OR array pages. Some or all of the array pages in one or both of the sets can be user programmable. Page selection may use the same means for selecting the OR array page as for selecting the AND array page so that selections of specific AND and OR array pages always coincide, thereby essentially providing a plurality of pages each consisting of a specific AND array and a specific OR array. Alternatively, the means for selecting the OR array page may operate independently from a separate means for selecting the AND array page. Embodiments are also described in which there is just a single OR array (M=1) with only AND array page selection being performed, or vice versa (N=1). Several pages can be selected to operate simultaneously. Input signals may be applied to the AND array pages either by input leads which are shared among all of the AND array pages, by input leads dedicated to specific pages or by a combination of shared and dedicated input leads. Connection of the input leads to the AND array pages may be by hard wiring or by using the page control circuitry to multiplex the appropriate input leads to the selected AND array page or pages. The multiplexer used for this purpose can be either fixed or programmable. Output signals from the OR array pages may be provided to output leads in a similar manner. The described configurations make available a large number of product terms and sum terms while providing a smaller array size, higher speed and lower power consumption by the organization of the logic arrays into pages and by turning off those pages which are not needed at the moment.

In U.S. Pat. No. 4,847,612, Kaplinsky describes a programmable logic device having a plurality of programmable functional units, each of which is a complete AND-OR array, that are interconnected by switches in a programmable interconnection matrix. All of the inputs to a functional unit are available to all of the AND gates of the AND array. The product terms produced by the AND array may be available to either all or some of the OR gates in the OR array of that functional unit. In one embodiment, two subchips, each with their own set of inputs, outputs, functional units and interconnection matrices, can be selectively interconnected to one another with a switching matrix so that some signals provided in one subchip can be shared with the other.

In U.S. Pat. No. 4,963,768, Agrawal et al. describe a programmable integrated circuit structure having a plurality of programmable logic devices, each providing output signals on their output lines that are a function of input signals on their input lines, and a programmable switch interconnection means for coupling at least one of the output signals from each logic device to selected input lines of any of the logic devices. In one embodiment, a logic device may have an AND array providing product terms to OR gates for summing the terms together. Some of the product terms can be either shared between adjacent OR gates, routed to just one OR gate or left unconnected, as selected by the user. All of the product terms within a logic device have a common set of inputs connected to the AND array.

It is an object of the invention to provide programmable logic devices having greater logic flexibility for a given performance level, i.e., without causing a performance degradation or increase in power consumption from the enlarging of AND arrays.

It is another object of the invention to provide programmable logic devices having increased performance, including lower power consumption and reduced AND array size, for a given logic capability, i.e. without also lowering the logic flexibility.

DISCLOSURE OF THE INVENTION

The above objects are met with a programmable logic device characterized by a layout that includes multiple first logic arrays, such as AND arrays, all effectively enabled and operating simultaneously, and that also includes the ability to combine intermediate term outputs from two or more different first logic arrays in a single second logic gate or array, such as an OR gate or array. Each of the first logic arrays has a different set of inputs. This layout thus provides a way to increase the total number of first logic array inputs that are available to individual second logic gates without having to increase the number of inputs to any single first logic array, since individual second logic gates or arrays can have simultaneous inputs from several first logic arrays.

In one embodiment, multiple AND arrays, each with a unique set of inputs, provide product term outputs to the inputs of one or more OR arrays, such that each OR array receives, on its inputs, product terms from every AND array. When there is more than one OR array in the device, product terms from each AND array are shared by the plural OR arrays. Because all of the AND arrays are always in operation, any one OR array will receive inputs simultaneously from all AND arrays at least when any input signal received by the AND arrays changes logic states.

A second embodiment has multiple AND arrays, all arrays being always enabled, and a plurality of OR gates. While some OR gates may receive product terms from only one of the AND arrays, others of the OR gates receive product terms from two adjacent AND arrays.

BEST MODE FOR CARRYING OUT THE INVENTION

The present invention will be described herein by reference to AND/OR logic in which AND arrays provide product terms to OR gates or OR arrays, which in turn provide sum-of-products outputs. However, other types of logic arrays may be implemented in accord with the invention. In general, first logic arrays provide intermediate terms to second logic gates or second logic arrays, which in turn provide final logic term outputs. For example, if OR/AND logic is implemented, the first logic arrays would be OR arrays providing intermediate terms that are sum terms to second logic gates or arrays. These second logic gates or arrays would be AND gates or arrays providing final logic term outputs that are product-of-sums outputs. Other commonly used array logics include NAND/NAND and NOR/NOR logics. All of these provide the same functional flexibility as AND/OR logic configurations.

Figure 1:
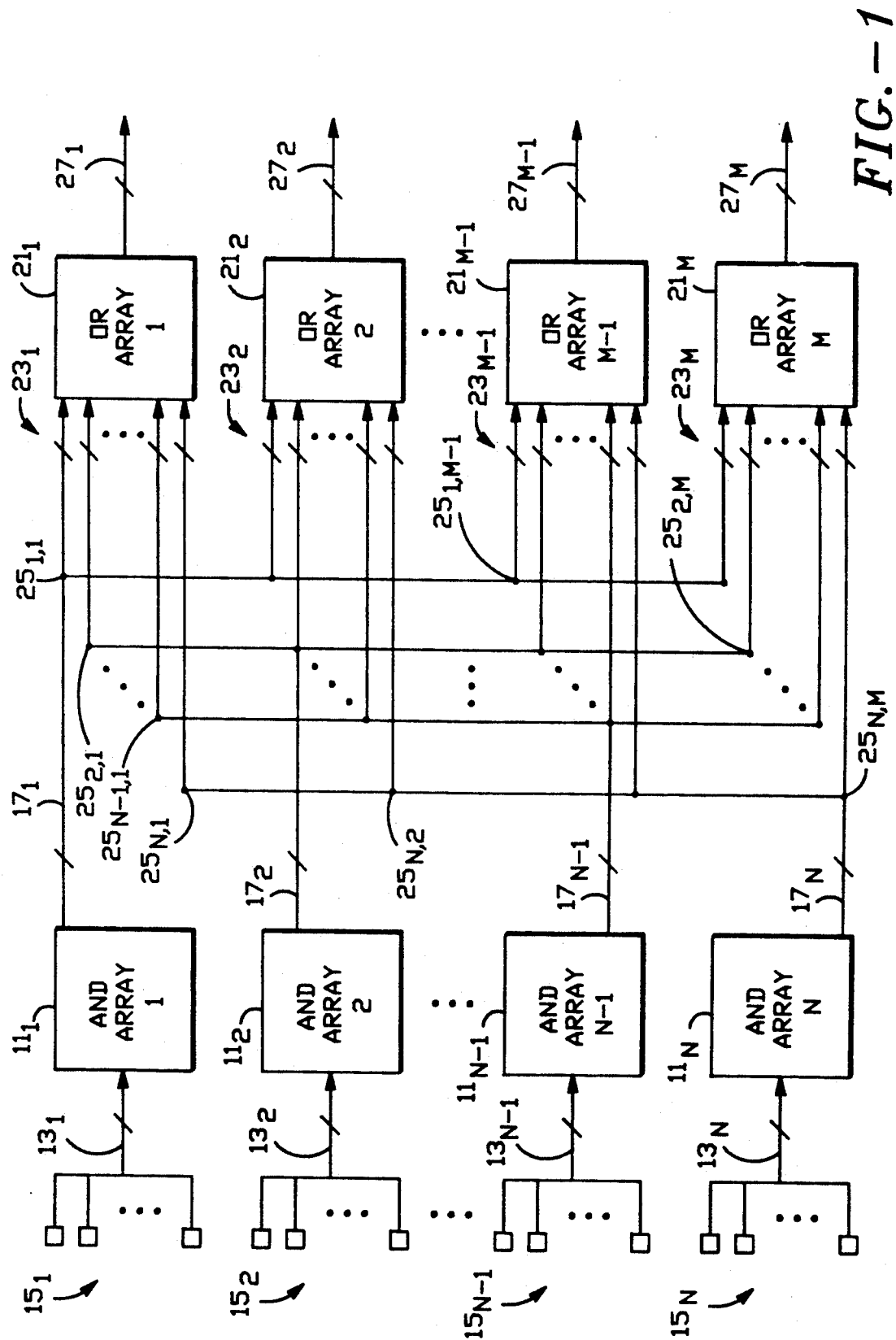
FIG. 1 is a schematic block diagram of a programmable logic device layout of the present invention.

With reference to FIG. 1, a programmable logic device includes a plurality N of AND arrays $11_1$, $11_2$, ..., $11_{N-1}$, $11_N$ and a plurality M of OR arrays $21_1$, $21_2$, ..., $21_{M-1}$, $21_M$. Each AND array $11_1$, $11_2$, ..., $11_{N-1}$, $11_N$ has inputs connected to corresponding dedicated input buses $13_1$, $13_2$, ..., $13_{N-1}$, $13_N$ to receive input signals from distinct sets $15_1$, $15_2$, ..., $15_{N-1}$, $15_N$ of signal sources, including external contacts of the device and internally generated logic from AND array outputs, OR array outputs and register outputs fed back to the input buses $13_1$, $13_2$, ..., $13_{N-1}$, $13_N$. Each AND array $11_1$, $11_2$, ..., $11_{N-1}$, $11_N$ also has outputs connected to a corresponding output bus $17_1$, $17_2$, ..., $17_{N-1}$, $17_N$ on each of which a set of product terms is provided by the AND array. The product terms provided by any particular AND array 11 are logic products or ANDs of selected input signals on the dedicated input buses 13 corresponding to that particular AND array. Each OR array $21_1$, $21_2$, ..., $21_{M-1}$, $21_M$ has inputs connected to a corresponding input bus $23_1$, $23_2$, ..., $23_{M-1}$, $23_M$ to receive product terms on output buses $17_1$, $17_2$, ..., $17_{N-1}$, $17_N$ of all of the AND arrays $11_1$, $11_2$, ..., $11_{N-1}$, $11_N$. Connection is made through a set of nodes $25_{1,1}$, $25_{1,2}$, ..., $25_{N,M-1}$, $25_{N,M}$. (The first subscript here designates the AND array from which the product term originates, while the second subscript designates the OR array to which the product term is destined.) Each node 25 is actually a plurality of connections between lines of output bus 17 and lines of an input bus 23, since each bus is composed of a plurality of lines. All OR array inputs $23_1$, $23_2$, ..., $23_{M-1}$, $23_M$ are enabled and effective at all times. Each OR array $21_1$, $21_2$, ..., $21_{M-1}$, $21_M$ has a set of outputs connected to a corresponding output bus $27_1$, $27_2$, ..., $27_{M-1}$, $27_M$ on which output terms are provided.

All AND arrays $11_1$, $11_2$, ..., $11_{N-1}$, $11_N$ and all OR gate or OR array inputs $23_1$, $23_2$, ..., $23_{M-1}$, $23_M$ are enabled and operate simultaneously, so that when any one AND array is operating all of the other AND arrays are also operating and when any one OR array input is enabled, all of the other OR array inputs of all OR arrays are likewise enabled. In a preferred embodiment, the AND and OR arrays include circuitry described in U.S. Pat. No. 4,906,870, assigned to the assignee of the present invention and incorporated herein by reference. This circuitry allows the AND arrays to disable and the OR outputs to latch, when no input signals on buses $13_1$, $13_2$, ..., $13_{N-1}$, $13_N$ are switching logic states. When any input signal does change logic state, all of the AND arrays $11_1$, $11_2$, ..., $11_{N-1}$, $11_N$ and OR array inputs $23_1$, $23_2$, ..., $23_{M-1}$, $23_M$ are simultaneously enabled. Alternatively, every AND array and OR array may be enabled and operating at all times.

Figure 2:
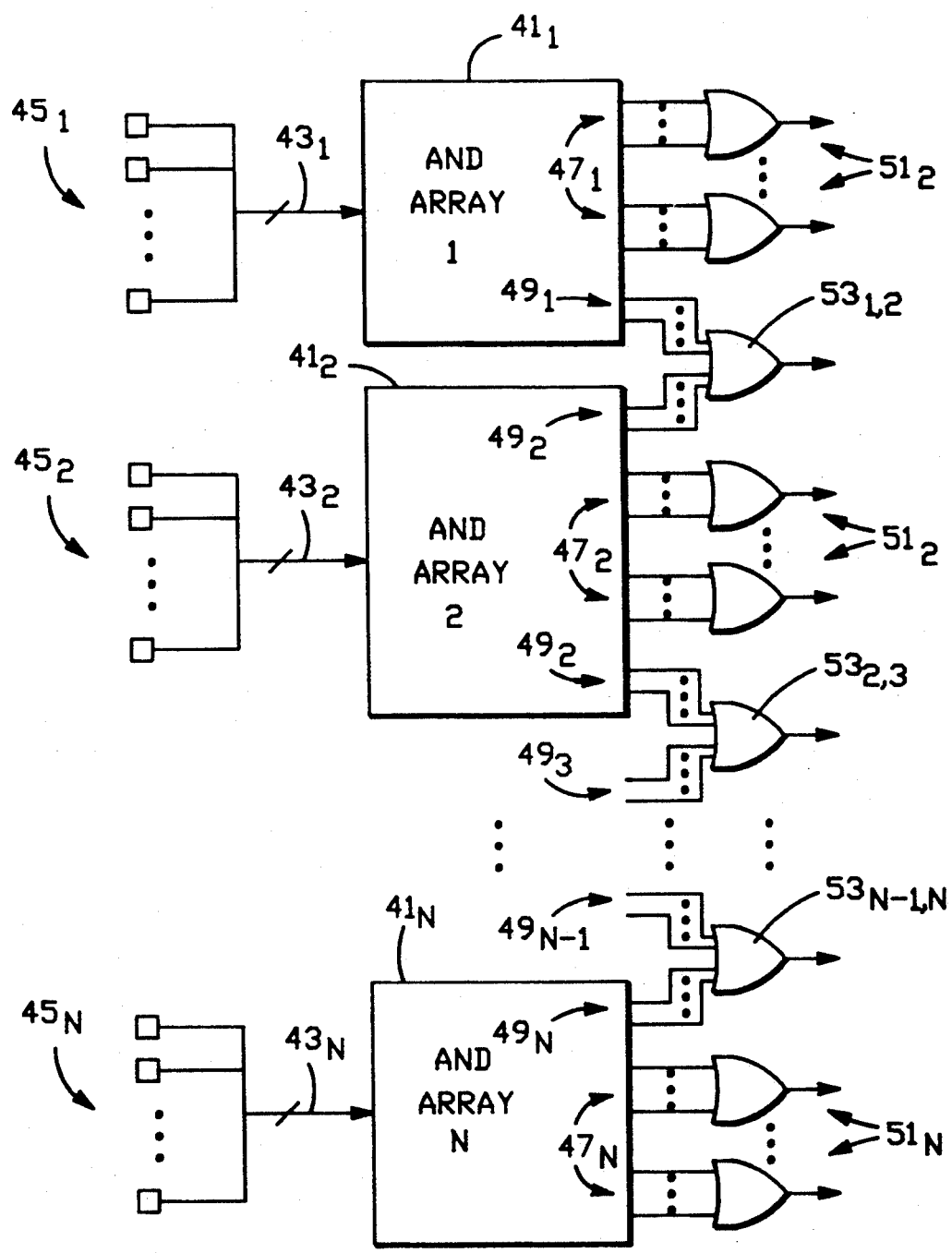
FIG. 2 is a schematic block diagram of an alternative programmable logic device layout of the present invention.

With reference to FIG. 2, another programmable logic device of the invention also includes a plurality N of AND arrays $41_1$, $41_2$, ..., $41_N$. Each AND array $41_1$, $41_2$, ..., $41_N$ has inputs connected to corresponding dedicated input buses $43_1$, $43_2$, ..., $43_N$ to receive input signals from distinct sets $45_1$, $45_2$, ..., $45_N$ of signal sources, which may include both external contacts of the device and internally generated logic from AND array outputs, OR array outputs and register inputs fed back to the input buses $43_1$, $43_2$, ..., $43_N$. Each AND array $41_1$, $41_2$, ..., $41_N$ also has outputs connected to output lines $47_1$, $47_2$, ..., $47_N$ and $49_1$, $49_2$, ..., $49_N$ on which product terms are provided by the corresponding AND array $41_1$, $41_2$, ..., $41_N$. The device also includes an OR array made up of a plurality of OR gates $51_1$, $51_2$, ..., $51_N$ and $53_{1,2}$, $53_{2,3}$, ..., $53_{N-1,N}$. OR gates $51_1$, $51_2$, ..., $51_N$ have inputs connected to the outputs $47_1$, $47_2$, ..., $47_N$ of just one corresponding AND array $41_1$, $41_2$, ..., $41_N$ each. The OR gates $53_{1,2}$, $53_{2,3}$, ..., $53_{N-1,N}$ have inputs connected to the outputs $49_1$, $49_2$, ..., $49_N$ of two adjacent AND arrays $41_1$, $41_2$, ..., $41_N$. That is, OR gate $53_{1,2}$ has inputs connected to outputs 49₁ and 49₂ of adjacent AND arrays 41₁ and 41₂, OR gate $53_{2,3}$ has inputs connected to outputs 49₂ and 49₃ of adjacent AND arrays 41₂ and 41₃, etc. The OR gates 51 and 53 may be connected to all of the outputs 47 and 49 of any given AND array 41, or just to a subset of outputs 47 and 49. Each output 47 and 49 of an AND array 41 may be connected to just one OR gate or be shared with several OR gates. However, each OR gate 51 and 53 generally has a different set of AND array output connections from all other OR gates.

The outputs of some OR gates may connect to inputs of a second stage of OR gates, not shown, in order to minimize the number of inputs required by any one OR gate. However, since the logic OR operation is associative, this alternative hierarchical structure does not fundamentally affect the overall logic being implemented. The second stage of OR gates may be the actual physical gates $53_{1,2}$, $53_{2,3}$, ..., $53_{N-1,N}$ combining the logic from two adjacent AND arrays by receiving intermediate terms from first state OR gates connected between individual AND arrays and the second stage of OR gates.

For a programmable logic device of the type shown in FIG. 1 with N AND arrays, receiving L inputs per AND array and providing P product terms per AND array, and with M OR arrays, each OR array can have a total of up to N·P inputs effectively enabled to receive product terms from the AND arrays at all times. Likewise, each OR array can have access through the AND arrays to up to N·L inputs to the AND arrays. A single AND array would require $N^2 \cdot L \cdot P$ switches to provide the same level of logic capability as is provided in this multiple AND array layout needing a total of only N·L·P switches in the AND arrays of FIG. 1.

Likewise, for a programmable logic device of the type shown in FIG. 2, again with N AND arrays, receiving L inputs per AND array and providing P product terms per AND array, and with each of N−1 OR gates connected to up to P product terms in two adjacent AND arrays, each OR gate can have up to 2·P inputs for receiving product terms and access up to 2·L AND array inputs.

I claim:
1. A programmable logic device comprising
a plurality of logic arrays of the type having rows and columns of identical switches for the programma- ble combination of array input signals, each logic array connected to a different set of inputs for receiving input signals therefrom, each logic array having a set of outputs and being operative to provide intermediate terms on said set of outputs as a function of selected input signals on said inputs to that logic array, all of said logic arrays being simultaneously enabled and operating at least when any input signal changes logic states, no logic array input being connected to receive a logic array intermediate term, and at least one logic gate having a set of inputs connected to outputs from a plurality of said logic arrays for receiving intermediate terms therefrom, said at least one logic gate having an output and being operative to provide a final logic term on said output as a function of said intermediate terms received on its inputs wherein all inputs to at least a pair of said logic arrays are separate and distinct.

2. The device of claim 1 wherein at least one input to a pair of said logic arrays is shared with an input of another logic array.

3. The device of claim 1 wherein there are a plurality of logic gates, each logic gate having a set of inputs connected to outputs from at least one of said logic arrays for receiving intermediate terms therefrom, at least one of said logic gates having inputs connected to outputs from a plurality of said logic arrays.

4. The device of claim 3 wherein all of said logic gates have inputs connected to outputs from a plurality of said logic arrays.

5. The device of claim 4 wherein all of said logic gates have inputs connected to outputs from all of said logic arrays, said logic arrays being first logic arrays and said plurality of logic gates forming a second logic array.

6. The device of claim 4 wherein all logic gates have inputs connected to outputs from two adjacent logic arrays.

7. The device of claim 3 wherein at least one of said logic gates has inputs connected to outputs from all of said logic arrays.

8. The device of claim 7 wherein all of said logic gates have inputs connected to outputs from all of said logic arrays, said logic arrays being first logic arrays and said logic gates forming at least one second logic arrays.

9. A programmable logic device comprising
a plurality of AND arrays of the type having an X-Y arrangement of programmable switches for combining array input signals, each AND arrays connected to receive input signals from a distinct set of inputs, each AND array providing a set of product terms, no input being connected to receive any of said AND array product terms, and a plurality of OR arrays, each OR array having inputs connected to receive product terms from all of said AND arrays, all OR array inputs being enabled and effective at all times, each OR array providing a set of output terms coupled to a set of outputs wherein all inputs to at least a pair of said AND arrays are separate and distinct.

10. A programmable logic device comprising
a plurality of first logic arrays of the type having rows and columns of identical switches for the programmable combination of array inputs, each first logic array connected to receive input signals from a distinct set of inputs, each first logic array providing a set of intermediate terms, no intermediate term being a member of a first array input set, and a plurality of second logic arrays, each second logic array having inputs connected to receive intermediate terms from all of said first logic arrays, all second logic array inputs being enabled and effective at least when any input signal received by said plurality of first logic arrays changes logic states, each second logic array providing a set of output terms coupled to a set of outputs.

11. A programmable logic device comprising
a plurality of first logic arrays of the type having rows and columns of programmable switches for combination of array input signals, each first logic array connected to receive input signals from a distinct set of inputs, each first logic array providing a set of intermediate terms, no intermediate term being a member of a first array input set, and a second logic array made up of a plurality of logic gates, each logic gate in said second logic array having inputs connected to receive intermediate terms from at least one of said first logic arrays, at least one of said logic gates connected to receive intermediate terms from a plurality of said first logic arrays, all logic gate inputs being enabled and effective at least when any input signal received by said plurality of first logic arrays changes logic states, each logic gate in said second logic array providing a set of output terms coupled to a set of outputs, wherein all inputs to at least a pair of said logic arrays are separate and distinct.

12. The programmable logic device of claim 11 wherein there is associated with each first logic array at least one logic gate with inputs connected to receive intermediate terms from both that first logic array and another first logic array.

13. A programmable logic device comprising
a plurality of AND arrays of the type having rows and columns of switches for combining array input signals, each AND array connected to a distinct set of inputs for receiving input signals therefrom, each AND array having a set of outputs and being operative to provide product terms on said set of outputs as a function of selected input signals on said inputs to that AND array, all of said AND arrays being simultaneously enabled and operating at all times, no AND array output signal being an AND array input signal, and at least one OR gate having a set of inputs connected to outputs from a plurality of said AND arrays for receiving product terms therefrom, said at least one OR gate having an output and being operative to provide a sum-of-products term on said output as a function of said product terms received on its inputs wherein all inputs to at least a pair of said AND arrays are separate and distinct.

14. The device of claim 13 wherein all inputs to each AND array are separate and distinct from inputs to every other AND array.

15. The device of claim 13 wherein at least one input to an AND array is shared with an input of another AND array.

16. The device of claim 13 wherein there are a plurality of OR gates, each OR gate having a set of inputs connected to outputs from at least one of said AND arrays for receiving product terms therefrom, at least one of said OR gates having inputs connected to outputs from a plurality of said AND arrays.

17. The device of claim 16 wherein all of said OR gates have inputs connected to outputs from a plurality of said AND arrays.

18. The device of claim 17 wherein all OR gates have inputs connected to outputs from two adjacent AND arrays.

19. The device of claim 17 wherein all of said OR gates have inputs connected to outputs from all of said AND arrays, said plurality of OR gates forming an OR array.

20. The device of claim 16 wherein at least one of said OR gates has inputs connected to outputs from all of said AND arrays.

21. The device of claim 20 wherein all of said OR gates have inputs connected to outputs from all of said AND arrays, said OR gates forming at least one OR array.

22. A programmable logic device comprising
a plurality of AND arrays of the type having rows and columns of identical switches for programmable combination of array inputs, each AND array connected to receive input signals from a distinct set of inputs, each AND array providing a set of product terms, no input being connected to receive any of said AND array product terms, and an OR array made up of a plurality of OR gates, each OR gate in said OR array having inputs connected to receive product terms from at least one of said AND arrays, at least one of said OR gates connected to receive product terms from a plurality of said AND arrays, all OR gate inputs being enabled and effective at all times, each OR gate in said OR array providing a set of output terms coupled to a set of outputs wherein all inputs to at least a pair of said AND arrays are separate and distinct.

23. The programmable logic device of claim 22 wherein there is associated with each AND array at least one OR gate with inputs connected to receive product terms from both that AND array and another AND array.

* * * * *